(12) United States Patent
Kutsunai et al.

(10) Patent No.: US 6,723,637 B2
(45) Date of Patent: Apr. 20, 2004

(54) SEMICONDUCTOR DEVICE AND METHOD FOR FABRICATING THE SAME

(75) Inventors: Toshie Kutsunai, Shiga (JP); Shinichiro Hayashi, Osaka (JP); Takumi Mikawa, Kyoto (JP); Yuji Judai, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/441,128

(22) Filed: May 20, 2003

(65) Prior Publication Data

US 2003/0207535 A1 Nov. 6, 2003

Related U.S. Application Data

(62) Division of application No. 09/921,884, filed on Aug. 6, 2001, now Pat. No. 6,590,252.

(30) Foreign Application Priority Data

Nov. 6, 2000 (JP) ........................................ 2000-337601

(51) Int. Cl.[7] .......................................... H01L 21/4763
(52) U.S. Cl. ...................... 438/643; 438/686; 438/253; 438/650
(58) Field of Search ................... 438/253, 686, 438/685, 642, 643, 648, 650

(56) References Cited

U.S. PATENT DOCUMENTS

| 5,744,832 | A | 4/1998 | Wolters et al. | |
|---|---|---|---|---|
| 5,965,942 | A | 10/1999 | Itoh et al. | |
| 6,498,094 | B2 * | 12/2002 | Nakao et al. | 438/650 |
| 2003/0132470 | A1 * | 7/2003 | Joshi et al. | 257/295 |
| 2003/0157798 | A1 * | 8/2003 | Gabric et al. | 438/686 |

FOREIGN PATENT DOCUMENTS

| JP | 10-93036 | 4/1998 |
|---|---|---|
| JP | 10-242078 | 9/1998 |
| WO | WO98/06131 | 2/1998 |

* cited by examiner

*Primary Examiner*—Van Thu Nguyen
*Assistant Examiner*—Brad Smith
(74) *Attorney, Agent, or Firm*—Nixon Peabody LLP; Donald R. Studebaker

(57) ABSTRACT

An impurity diffusion layer serving as the source or the drain of a transistor is formed in a semiconductor substrate, and a protection insulating film is formed so as to cover the transistor. A capacitor lower electrode, a capacitor dielectric film of an oxide dielectric film and a capacitor upper electrode are successively formed on the protection insulating film. A plug for electrically connecting the impurity diffusion layer of the transistor to the capacitor lower electrode is buried in the protection insulating film. An oxygen barrier layer is formed between the plug and the capacitor lower electrode. The oxygen barrier layer is made from a composite nitride that is a mixture or an alloy of a first nitride having a conducting property and a second nitride having an insulating property.

4 Claims, 5 Drawing Sheets

SEMICONDUCTOR DEVICE AND METHOD FOR FABRICATING THE SAME

This is a division of application Ser. No. 09/921,884 filed Aug. 6, 2001, now U.S. Pat. No. 6,590,252.

BACKGROUND OF THE INVENTION

The present invention relates to a semiconductor device including a capacitor device having a capacitor dielectric film of an oxide dielectric film such as a ferroelectric film and a high dielectric film, and a method for fabricating the semiconductor device.

In a recently accelerated trend in processing and storing massive data resulting from development of digital technology, electronic equipment have been more and more highly developed, and therefore, semiconductor devices used in electronic equipment have been rapidly developed in their refinement.

Accordingly, in order to realize a high degree of integration in a dynamic RAM, a technique to use an oxide dielectric film as a capacitor dielectric film instead of a conventionally used silicon oxide or silicon nitride film has been widely studied and developed.

Also, in order to realize practical use of a nonvolatile RAM capable of operating at a lower voltage and writing/reading data at a higher speed, ferroelectric films having a spontaneous polarization characteristic are earnestly studied.

In a semiconductor memory using a ferroelectric film or a high dielectric film, in order to attain a high degree of integration of a megabit-class, stack-type memory cells are used instead of conventionally used planer-type memory cells. The most significant problem in employing the stack-type memory cells is preventing a contact face between a plug and a lower electrode of a capacitor device from being oxidized in high temperature annealing carried out in an oxygen atmosphere for crystallizing the ferroelectric film or the high dielectric film.

A conventional semiconductor device will now be described with reference to FIG. 6A.

As shown in FIG. 6A, impurity diffusion layers 11 serving as the source and the drain are formed in a semiconductor substrate 10, and a gate electrode 12 is formed on a region of the semiconductor substrate 10 sandwiched between the impurity diffusion layers 11. The impurity diffusion layers 11 and the gate electrode 12 together form a transistor.

A protection insulating film 13 is formed on the semiconductor substrate 10 so as to cover the transistor, and a plug 14 of, for example, tungsten connected to one of the impurity diffusion layers 11 is formed in the protection insulating film 13.

An adhesive layer 15 of titanium having a lower face in contact with the upper face of the plug 14 is formed on the protection insulating film 13. An oxygen barrier layer 16 of iridium oxide is formed on the adhesive layer 15, and a capacitor device composed of a capacitor lower electrode 17, a capacitor dielectric film 18 of a ferroelectric film and a capacitor upper electrode 19 is formed on the oxygen barrier layer 16. Accordingly, one of the impurity diffusion layers 11 of the transistor is electrically connected to the capacitor lower electrode 17 through the plug 14.

The oxygen barrier layer 16 has a function to prevent oxidation of the plug 14, and the adhesive layer 15 has a function to improve adhesion between the oxygen barrier layer 16 and the plug 14.

In order to crystallize the ferroelectric film used for forming the capacitor dielectric film 18, it is necessary to carry out annealing at a temperature of 600 through 800 in an oxygen atmosphere. During this annealing, a metal oxide film with high resistance is formed in the vicinity of the interface between the plug 14 and the adhesive layer 15, which disadvantageously increases the contact resistance between the plug 14 and the lower electrode 17.

Therefore, the present inventors have variously studied the cause of the formation of the metal oxide film in the vicinity of the interface between the plug 14 and the adhesive layer 15, resulting in finding the following:

FIG. 6B shows migration paths of oxygen atoms in the conventional semiconductor device, wherein denotes an oxygen atom and an arrow denotes a migration path of the oxygen atom.

In the annealing for crystallizing the ferroelectric film used for forming the capacitor dielectric film 18, oxygen atoms included in the oxygen atmosphere are diffused into the capacitor dielectric film 18, then migrate through a first path for passing through the capacitor lower electrode 17 and the oxygen barrier layer 16 to reach the adhesive layer 15 and through a second path for passing through a side portion of the capacitor dielectric film 18 to reach the adhesive layer 15, and finally reach the plug 14.

Although the oxygen barrier layer 16 of iridium oxide is formed on the plug 14, the oxygen barrier layer 16 cannot definitely prevent the passage of the oxygen atoms because the annealing for crystallization is carried out in an oxygen atmosphere at a high temperature.

Also, when the oxygen atoms reach the adhesive layer 15, titanium included in the adhesive layer 15 is easily oxidized into titanium oxide, and hence, the oxygen atoms reach the plug 14 after thus oxidizing the adhesive layer. The oxygen atoms having reached the plug 14 oxidize a metal, such as tungsten, included in the plug 14, which disadvantageously increases the contact resistance between the capacitor lower electrode 17 and the plug 14.

Furthermore, when the oxygen atoms reach the oxygen barrier layer 16, pin holes may be formed or the thickness is locally reduced in the oxygen barrier layer 16. Therefore, in a contact chain used for a test and including thousands or ten thousands of serially connected plugs 14, the resistance becomes abnormally high when the diameter of each plug 14 is small.

SUMMARY OF THE INVENTION

In consideration of the aforementioned conventional problems, an object of the invention is preventing contact resistance between a capacitor lower electrode and a plug from increasing by definitely preventing oxidation of the plug.

In order to achieve the object, the first semiconductor device of this invention comprises an impurity diffusion layer serving as a source or a drain of a transistor formed in a semiconductor substrate; a protection insulating film covering the transistor; a capacitor lower electrode, a capacitor dielectric film of an oxide dielectric film and a capacitor upper electrode successively formed on the protection insulating film; a plug buried in the protection insulating film for electrically connecting the impurity diffusion layer of the transistor to the capacitor lower electrode; and an oxygen barrier layer formed between the plug and the capacitor lower electrode, and the oxygen barrier layer is made from a composite nitride that is a mixture or an alloy of a first nitride having a conducting property and a second nitride having an insulating property.

In the first semiconductor device of the invention, the oxygen barrier layer formed between the plug and the capacitor lower electrode is made from the composite nitride that is a mixture or an alloy of the first nitride having a conducting property and the second nitride having an insulating property. In an oxygen atmosphere at a high temperature, the second nitride having an insulating property is more highly reactive with oxygen atoms than the first nitride having a conducting property.

Therefore, in crystallizing the capacitor dielectric film of the oxide dielectric film in an oxygen atmosphere at a high temperature, when the oxygen atoms diffuse into the oxygen barrier layer, the second nitride having an insulating property is rapidly reacted with the oxygen atoms to produce an oxide in a surface portion of the oxygen barrier layer. Since an oxide has a smaller particle size than a nitride, when the nitride is changed into the oxide, the migration paths of the oxygen atoms formed in the grain boundary of the nitride becomes complicated and elongated, which makes it difficult for the oxygen atoms to diffuse within the oxygen barrier layer. In other words, since an oxide layer for preventing diffusion of the oxygen atoms is formed in the surface portion of the oxygen barrier layer, the function of the oxygen barrier layer to prevent diffusion of the oxygen atoms can be improved.

When the nitride is changed into the oxide, the resistance of the oxygen barrier layer may be increased. The composite nitride includes, however, the first nitride having a conducting property that is comparatively less reactive with the oxygen atoms, which suppresses the increase of the resistance of the oxygen barrier layer.

Accordingly, while suppressing the increase of the resistance, the oxygen barrier layer can definitely prevent the diffusion of the oxygen atoms, resulting in definitely preventing oxidation of the plug.

In the first semiconductor device, the first nitride is preferably a nitride of at least one of titanium, tantalum, cobalt, copper and gallium, and the second nitride is preferably a nitride of at least one of aluminum, silicon, chromium, iron, zirconium and hafnium.

When the nitride of aluminum, silicon, chromium, iron, zirconium or hafnium is brought into contact with oxygen atoms at a high temperature, the nitride rapidly changes into an oxide, so as to prevent the diffusion of the oxygen atoms. Therefore, the function of the oxygen barrier layer to prevent the diffusion of the oxygen atoms can be definitely improved. Furthermore, since the nitride of titanium, tantalum, cobalt, copper or gallium is difficult to oxidize even at a high temperature and is less degraded in its conducting property even when oxidized, the increase of the resistance of the oxygen barrier layer can be suppressed.

The first semiconductor device preferably further comprises an upper oxygen barrier layer formed between the oxygen barrier layer and the capacitor lower electrode and made from a metal that has a conducting property when it is oxidized.

When the upper oxygen barrier layer of the metal that has a conducting property even when oxidized is thus formed on the oxygen barrier layer, two oxygen barrier layers are present on the plug. Therefore, the function to prevent the diffusion of the oxygen atoms can be further improved and the increase of the resistance can be prevented.

In this case, the metal is preferably at least one of iridium, ruthenium, rhenium, osmium, rhodium, platinum and gold.

Thus, when the oxygen atoms diffuse into the upper oxygen barrier layer, a metal oxide layer that prevents the migration of the oxygen atoms and does not have very high resistance is formed in a surface portion of the upper oxygen barrier layer. Therefore, the diffusion of the oxygen atoms can be more effectively prevented.

The first semiconductor device preferably further comprises an upper oxygen barrier layer formed between the oxygen barrier layer and the capacitor lower electrode and made from a metal oxide having a conducting property.

When the upper oxygen barrier layer of the metal oxide having a conducting property is thus formed on the oxygen barrier layer, two oxygen barrier layers are present on the plug. Therefore, the function to prevent the diffusion of the oxygen atoms can be further improved and the increase of the resistance can be prevented.

In this case, the metal oxide is preferably at least one of an iridium oxide, a ruthenium oxide, a rhenium oxide, an osmium oxide and a rhodium oxide.

Thus, the oxygen atoms diffusing through the upper oxygen barrier layer are prevented from migrating by the metal oxide, and hence, the diffusion of the oxygen atoms can be more effectively prevented.

The first semiconductor device preferably further comprises an upper oxygen barrier layer of a multi-layer structure composed of a first metal layer of a metal that has a conducting property when it is oxidized and a second metal layer of a metal oxide having a conducting property.

Thus, even when a defect is caused in one of the first metal layer and the second metal layer, the other metal layer can prevent the passage of the oxygen atoms. Therefore, the diffusion of the oxygen atoms can be definitely prevented.

The second semiconductor device of this invention comprises an impurity diffusion layer serving as a source or a drain of a transistor formed in a semiconductor substrate; a first protection insulating film covering the transistor; a plug buried in the first protection insulating film and having a lower end electrically connected to the impurity diffusion layer of the transistor; an oxygen barrier layer formed on the first protection insulating film and having a lower face connected to an upper end of the plug; a capacitor lower electrode formed on the oxygen barrier layer; a second protection insulating film formed on the first protection insulating film to cover peripheral faces of the oxygen barrier layer and the capacitor lower electrode and having an upper face placed at substantially the same level as an upper face of the capacitor lower electrode; a capacitor dielectric film made from an oxide dielectric film formed on the capacitor lower electrode and the second protection insulating film and having a plane shape larger than a plane shape of the capacitor lower electrode; and a capacitor upper electrode formed on the capacitor dielectric film.

In the second semiconductor device of this invention, the second protection insulating film is formed so as to cover the peripheral face of the oxygen barrier layer. Therefore, in crystallizing the capacitor dielectric film of the oxide dielectric film in an oxygen atmosphere at a high temperature, oxygen atoms included in the oxygen atmosphere pass through the second protection insulating film before reaching the oxygen barrier layer, and hence, the number of oxygen atoms that can reach the oxygen barrier layer can be reduced. Also, since the capacitor dielectric film has a plane shape larger than that of the capacitor lower electrode, the oxygen atoms included in the oxygen atmosphere migrate by a long distance, namely, take a roundabout way, within the second protection insulating film before reaching the oxygen barrier layer. Therefore, the number of oxygen atoms that can reach the oxygen barrier layer can be further reduced.

Accordingly, the number of oxygen atoms that diffuse through the oxygen barrier layer to reach the plug can be largely reduced, resulting in definitely preventing the oxidation of the plug.

In the second semiconductor device, the oxygen barrier layer is preferably made from a composite nitride that is a mixture or an alloy of a first nitride having a conducting property and a second nitride having an insulating property.

Thus, when the oxygen atoms pass through the second protection insulating film to reach the oxygen barrier layer, the second nitride having an insulating property is changed into an oxide in a surface portion of the oxygen barrier layer. Therefore, the oxygen atoms are difficult to diffuse into the oxygen barrier layer, resulting in largely improving the function of the oxygen barrier layer to prevent the diffusion of the oxygen atoms.

The second semiconductor device preferably further comprises an upper oxygen barrier layer formed between the oxygen barrier layer and the capacitor lower electrode and made from a metal that has a conducting property when it is oxidized.

Thus, two oxygen barrier layers are present on the plug, and hence, the function to prevent the diffusion of the oxygen atoms can be further improved, and the increase of the resistance can be prevented.

The second semiconductor device preferably further comprises an upper oxygen barrier layer formed between the oxygen barrier layer and the capacitor lower electrode and made from a metal oxide having a conducting property.

Thus, two oxygen barrier layers are present on the plug, and hence, the function to prevent the diffusion of the oxygen atoms can be further improved, and the increase of the resistance can be prevented.

The method for fabricating a semiconductor device of this invention comprises the steps of forming an impurity diffusion layer serving as a source or a drain of a transistor in a semiconductor substrate; forming a first protection insulating film covering the transistor; burying, in the first protection insulating film, a plug having a lower end electrically connected to the impurity diffusion layer of the transistor; forming, on the first protection insulating film, an oxygen barrier layer having a lower face connected to an upper end of the plug; forming a capacitor lower electrode on the oxygen barrier layer; forming, on the first protection insulating film, a second protection insulating film covering the oxygen barrier layer and the capacitor lower electrode, and planarizing the second protection insulating film, whereby placing an upper face of the second protection insulating film at substantially the same level as an upper face of the capacitor lower electrode; forming a capacitor dielectric film having a plane shape larger than a plane shape of the capacitor lower electrode by depositing an oxide dielectric film on the capacitor lower electrode and the second protection insulating film and patterning the oxide dielectric film; and forming a capacitor upper electrode on the capacitor dielectric film.

In the method for fabricating a semiconductor device of this invention, after forming the second protection insulating film so as to cover the oxygen barrier layer and the capacitor lower electrode, the second protection insulating film is planarized so as to place the upper face of the second protection insulating film at substantially the same level as the upper face of the capacitor lower electrode. Therefore, the capacitor dielectric film of the oxide dielectric film is crystallized in an oxygen atmosphere at a high temperature with the peripheral face of the oxygen barrier layer covered with the second protection insulating film, and hence, oxygen atoms included in the oxygen atmosphere pass through the second protection insulating film before reaching the oxygen barrier layer. Also, since the capacitor dielectric film has a plane shape larger than that of the capacitor lower electrode, the oxygen atoms included in the oxygen atmosphere migrate by a long distance within the second protection insulating film before reaching the oxygen barrier layer, and hence, the number of oxygen atoms that can reach the oxygen barrier layer can be largely reduced.

Accordingly, the number of oxygen atoms that diffuse through the oxygen barrier layer to reach the plug can be largely reduced, resulting in definitely preventing oxidation of the plug.

In the method for fabricating a semiconductor device, the oxygen barrier layer is preferably made from a composite nitride that is a mixture or an alloy of a first nitride having a conducting property and a second nitride having an insulating property.

Thus, when the oxygen atoms pass through the second protection insulating film to reach the oxygen barrier layer, the second nitride having an insulating property is changed into an oxide in a surface portion of the oxygen barrier layer. Therefore, the oxygen atoms are difficult to diffuse into the oxygen barrier layer, and hence, the function of the oxygen barrier layer to prevent the diffusion of the oxygen atoms can be largely improved.

The method for fabricating a semiconductor device preferably further comprises, between the step of forming the oxygen barrier layer and the step of forming the capacitor lower electrode, a step of forming an upper oxygen barrier layer made from a metal that has a conducting property when it is oxidized.

Thus, since two oxygen barrier layers are present on the plug, the function to prevent the diffusion of the oxygen atoms can be further improved, and increase of the resistance can be prevented.

The method for fabricating a semiconductor device preferably further comprises, between the step of forming the oxygen barrier layer and the step of forming the capacitor lower electrode, a step of forming an upper oxygen barrier layer made from a metal oxide having a conducting property.

Thus, two oxygen barrier layers are present on the plug, the function to prevent the diffusion of the oxygen atoms can be further improved, and the increase of the resistance can be prevented.

DETAILED DESCRIPTION OF THE INVENTION

Embodiment 1

A semiconductor device according to Embodiment 1 of the invention will now be described with reference to FIG. 1A.

Figure 1A:
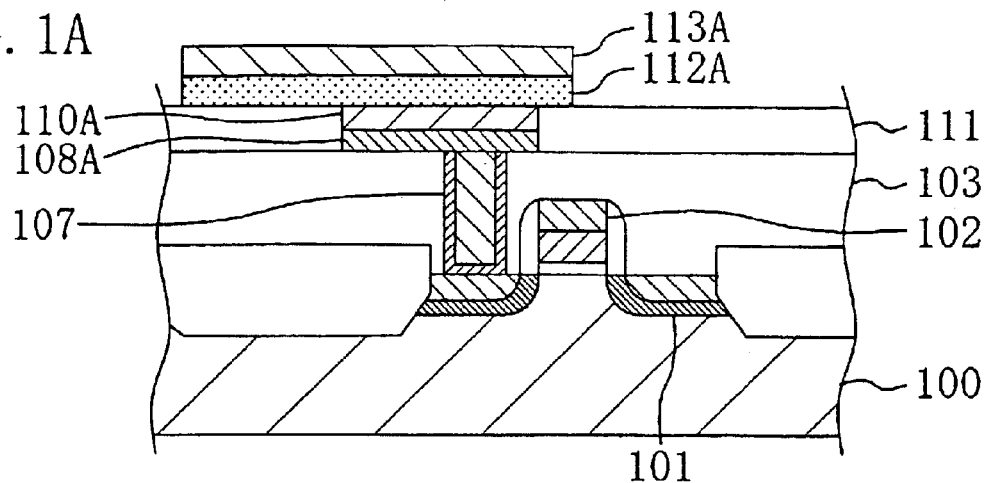
FIG. 1A is a cross-sectional view of a semiconductor device according to Embodiment 1 of the invention.

As shown in FIG. 1A, a pair of impurity diffusion layers 101 serving as the source and the drain of a transistor are formed in a semiconductor substrate 100, and a gate electrode 102 of the transistor is formed on a region of the semiconductor substrate 100 sandwiched between the pair of impurity diffusion layers 101.

A first protection insulating film 103 of, for example, a TEOS-$O_3$ film is formed on the semiconductor substrate 100 so as to cover the transistor, and a plug 107 of tungsten having a lower end connected to one of the pair of impurity diffusion layers 101 is buried in the first protection insulating film 103. The plug 107 includes a barrier metal composed of an outside titanium film with a thickness of, for example, 30 nm and an inside titanium nitride film with a thickness of, for example, 50 nm. The upper face of the plug 107 is placed at substantially the same level as the upper face of the first protection insulating film 103.

An oxygen barrier layer 108A with a thickness of 20 nm through 200 nm having a lower face connected to the upper end of the plug 107 is formed on the first protection insulating film 103. The oxygen barrier layer 108A is made from a composite nitride that is a mixture or an alloy of a first nitride having a conducting property and a second nitride having an insulating property. The first nitride may be a nitride of at least one of titanium, tantalum, cobalt, copper and gallium, and the second nitride may be a nitride of at least one of aluminum, silicon, chromium, iron, zirconium and hafnium.

A capacitor lower electrode 110A of a platinum film with a thickness of, for example, 50 nm is formed on the oxygen barrier layer 108A.

The peripheral faces of the oxygen barrier layer 108A and the capacitor lower electrode 110A are covered with a second protection insulating film 111, and the upper face of the second protection insulating film 111 is placed at substantially the same level as the upper face of the capacitor lower electrode 110A.

A capacitor dielectric film 112A of an oxide dielectric film such as a ferroelectric film and a high dielectric film with a thickness of 10 nm through 200 nm is formed on the second protection insulating film 111 so as to have a lower face in contact with the capacitor lower electrode 110A. The capacitor dielectric film 112A is in contact with the capacitor lower electrode 110A and has a plane shape larger than that of the capacitor lower electrode 110A. The oxide dielectric film is not specified in its kind, and may be a ferroelectric film having a bismuth-layered perovskite structure such as $SrBi_2(Ta_{1-x}Nb_x)O_9$, or a film of lead zirconate titanate, strontium barium titanate, tantalum pentaoxide or the like.

A capacitor upper electrode 113A of a platinum film with a thickness of, for example, approximately 50 nm is formed on the capacitor dielectric film 112A, and the capacitor dielectric film 112A and the capacitor upper electrode 113A are covered with a third protection insulating film not shown.

In the semiconductor device of Embodiment 1, the oxygen barrier layer 108A of the composite nitride that is a mixture or an alloy of the first nitride having a conducting property and the second nitride having an insulating property is formed between the plug 107 and the capacitor lower electrode 110A. In an oxygen atmosphere at a high temperature, the second nitride having an insulating property is more highly reactive with oxygen atoms than the first nitride having a conducting property. Therefore, in crystallizing the capacitor dielectric film 112A of the oxide dielectric film in an oxygen atmosphere at a high temperature, when oxygen atoms are diffused into the oxygen barrier layer 108A, the second nitride having an insulating property is rapidly reacted with the oxygen atoms to produce an oxide in a surface portion of the oxygen barrier layer 108A. Since an oxide has a smaller particle size than a nitride, when the nitride is changed into the oxide, migration paths of the oxygen atoms formed in the grain boundary of the nitride become complicated and elongated, which makes difficult for the oxygen atoms to diffuse into the oxygen barrier layer 108A. In other words, an oxide layer for preventing the diffusion of the oxygen atoms is formed in the surface portion of the oxygen barrier layer 108A, and hence, the function of the oxygen barrier layer 108A for preventing the diffusion of the oxygen atoms can be improved.

When the nitride is changed into the oxide, the resistance of the oxygen barrier layer 108A may be increased. However, since the composite nitride includes the first nitride having a conducting property that is comparatively less reactive with the oxygen atoms, the increase of the resistance of the oxygen barrier layer 108A can be suppressed.

Accordingly, while suppressing the increase of the resistance, the oxygen barrier layer 108A can definitely prevent the diffusion of the oxygen atoms, and therefore, oxidation of the plug 107 can be definitely prevented.

Furthermore, since the second nitride included in the oxygen barrier layer 108A is made from a nitride of aluminum, silicon, chromium, iron, zirconium or hafnium, when it is brought into contact with the oxygen atoms at a high temperature, it is rapidly changed into the oxide, resulting in preventing the diffusion of the oxygen atoms. Accordingly, the function of the oxygen barrier layer 108A to prevent the diffusion of the oxygen atoms can be definitely improved.

Moreover, since the first nitride included in the oxygen barrier layer 108A is made from a nitride of titanium, tantalum, cobalt, copper or gallium, it is difficult to oxide even at a high temperature, and even when it is oxidized, its conducting property is less degraded. Therefore, the increase of the resistance of the oxygen barrier layer 108A can be suppressed.

Also, since the peripheral face of the oxygen barrier layer 108A is covered with the second protection insulating film 111, in crystallizing the capacitor dielectric film 112A of the oxide dielectric film in an oxygen atmosphere at a high temperature, the oxygen atoms included in the oxygen atmosphere pass through the second protection insulating film 111 before reaching the oxygen barrier layer 108A. Therefore, the number of oxygen atoms that can reach the oxygen barrier layer 108A can be reduced.

In addition, since the capacitor dielectric film 112A has a plane shape larger than that of the capacitor lower electrode 110A, the oxygen atoms included in the oxygen atmosphere migrate by a long distance, namely, take a roundabout way, within the second protection insulating film 111 before reaching the oxygen barrier layer 108A. Therefore, the number of oxygen atoms that can reach the oxygen barrier layer 108A can be further reduced.

Accordingly, since the number of oxygen atoms that are diffused through the oxygen barrier layer 108A to reach the plug 107 can be largely reduced, the oxidation of the plug 107 can be definitely prevented.

Embodiment 2

A semiconductor device according to Embodiment 2 of the invention will now be described with reference to FIG. 1B.

Figure 1B:
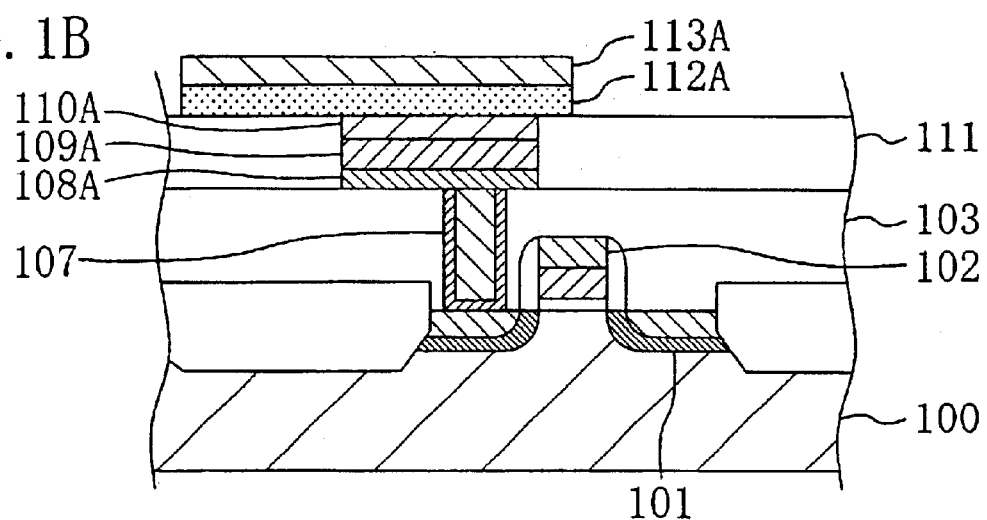
FIG. 1B is a cross-sectional view of a semiconductor device according to Embodiment 2 of the invention and FIG. 1C is a cross-sectional view of a semiconductor device according to Embodiment 3 of the invention.

As shown in FIG. 1B, a pair of impurity diffusion layers 101 serving as the source and the drain of a transistor are formed in a semiconductor substrate 100, and a gate electrode 102 of the transistor is formed on a region of the semiconductor substrate 100 sandwiched between the pair of impurity diffusion layers 101.

A first protection insulating film 103 of, for example, a TEOS-$O_3$ film is formed on the semiconductor substrate 100 so as to cover the transistor, and a plug 107 of tungsten having a lower end connected to one of the pair of impurity diffusion layers 101 is buried in the first protection insulating film 103. The plug 107 includes a barrier metal composed of, for example, a titanium film and a titanium nitride film, and the upper face of the plug 107 is placed at substantially the same level as the upper face of the first protection insulating film 103.

An oxygen barrier layer 108A with a thickness of 20 nm through 200 nm having a lower face connected to the upper end of the plug 107 is formed on the first protection insulating film 103. The oxygen barrier layer 108A is made from a composite nitride that is a mixture or an alloy of a first nitride having a conducting property and a second nitride having an insulating property. The first nitride may be a nitride of at least one of titanium, tantalum, cobalt, copper and gallium, and the second nitride may be a nitride of at least one of aluminum, silicon, chromium, iron, zirconium and hafnium.

An upper oxygen barrier layer 109A with a thickness of, for example, 100 nm of a metal that has a conducting property even when oxidized is formed on the oxygen barrier layer 108A. The metal that has a conducting property even when oxidized may be at least one of iridium, ruthenium, rhenium, osmium, rhodium, platinum and gold.

A capacitor lower electrode 110A of a platinum film with a thickness of, for example, 50 nm is formed on the upper oxygen barrier layer 109A. The peripheral faces of the oxygen barrier layer 108A, the upper oxygen barrier layer 109A and the capacitor lower electrode 110A are covered with a second protection insulating film 111, and the upper face of the second protection insulating film 111 is placed at substantially the same level as the upper face of the capacitor lower electrode 110A.

A capacitor dielectric film 112A of an oxide dielectric film such as a ferroelectric film and a high dielectric film with a thickness of 10 nm through 200 nm is formed on the second protection insulating film 111 so as to have a lower face in contact with the capacitor lower electrode 110A. The capacitor dielectric film 112A is in contact with the capacitor lower electrode 110A and has a plane shape larger than that of the capacitor lower electrode 110A. The oxide dielectric film is not specified in its kind, and may be a ferroelectric film having a bismuth-layered perovskite structure such as $SrBi_2(Ta_{1-x}Nb_x)O_9$, or a film of lead zirconate titanate, strontium barium titanate, tantalum pentaoxide or the like.

A capacitor upper electrode 113A of a platinum film with a thickness of, for example, approximately 50 nm is formed on the capacitor dielectric film 112A, and the capacitor dielectric film 112A and the capacitor upper electrode 113A are covered with a third protection insulating film not shown.

In the semiconductor device of Embodiment 2, the upper oxygen barrier layer 109A is formed between the oxygen barrier layer 108A and the capacitor lower electrode 110A. Therefore, the diffusion of the oxygen atoms can be more effectively prevented than in the semiconductor device of Embodiment 1, and hence, the oxidation of the plug 107 can be more definitely prevented.

In the case where the upper oxygen barrier layer 109A is made from at least one of iridium, ruthenium, rhenium, osmium, rhodium, platinum and gold, a metal oxide layer that prevents the migration of the oxygen atoms and does not largely increase the resistance is formed in a surface portion of the upper oxygen barrier layer 109A when the oxygen atoms are diffused into the upper oxygen barrier layer 109A. Accordingly, the diffusion of the oxygen atoms can be more definitely prevented.

Instead of the metal that has a conducting property even when oxidized, a metal oxide having a conducting property including at least one of an iridium oxide, a ruthenium oxide, a rhenium oxide, an osmium oxide and a rhodium oxide may be used as the metal included in the upper oxygen barrier layer 109A.

Embodiment 3

A semiconductor device according to Embodiment 3 of the invention will now be described with reference to FIG. 1C.

Figure 1C:
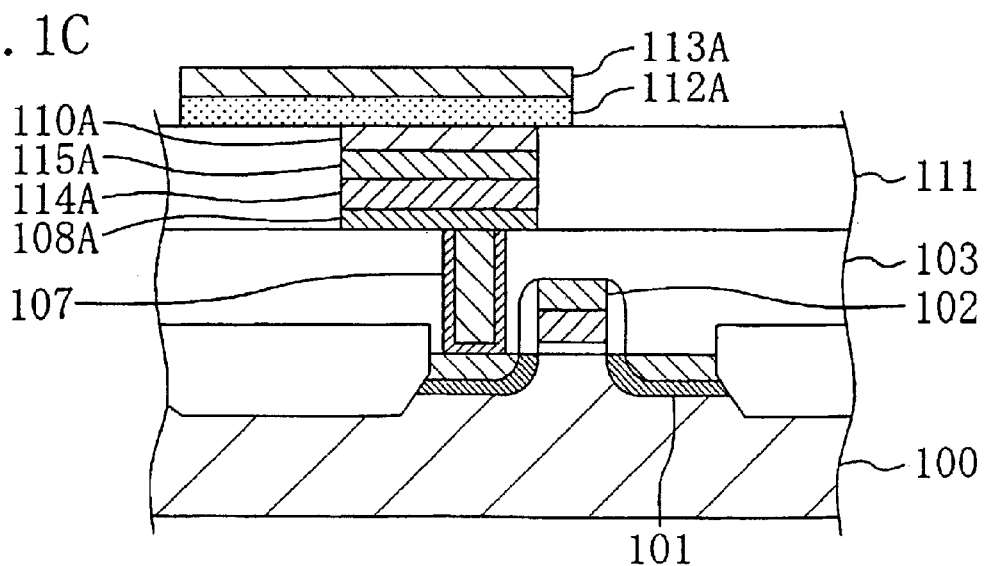

As shown in FIG. 1C, a pair of impurity diffusion layers 101 serving as the source and the drain of a transistor are formed in a semiconductor substrate 100, and a gate electrode 102 of the transistor is formed on a region of the semiconductor substrate 100 sandwiched between the pair of impurity diffusion layers 101.

A first protection insulating film 103 of, for example, a TEOS-$O_3$ film is formed on the semiconductor substrate 100 so as to cover the transistor, and a plug 107 of tungsten having a lower end connected to one of the pair of impurity diffusion layers 101 is buried in the first protection insulating film 103. The plug 107 includes a barrier metal composed of, for example, a titanium film and a titanium nitride film. The upper face of the plug 107 is placed at substantially the same level as the upper face of the first protection insulating film 103.

An oxygen barrier layer 108A with a thickness of 20 nm through 200 nm having a lower face connected to the upper end of the plug 107 is formed on the first protection insulating film 103. The oxygen barrier layer 108A is made from a composite nitride that is a mixture or an alloy of a first nitride having a conducting property and a second nitride having an insulating property. The first nitride may be a nitride of at least one of titanium, tantalum, cobalt, copper and gallium, and the second nitride may be a nitride of at least one of aluminum, silicon, chromium, iron, zirconium and hafnium.

A first upper oxygen barrier layer 114A of a metal that has a conducting property even when oxidized and a second upper oxygen barrier layer 115A of a metal oxide having a conducting property are successively formed on the oxygen barrier layer 108A. Either of the first upper oxygen barrier layer 114A and the second upper oxygen barrier layer 115A may be disposed below. The metal that has a conducting property even when oxidized used for forming the first upper oxygen barrier layer 114A may be at least one of iridium, ruthenium, rhenium, osmium, rhodium, platinum and gold. The metal oxide having a conducting property used for forming the second upper oxygen barrier layer 115A may be at least one of an iridium oxide, a ruthenium oxide, a rhenium oxide, an osmium oxide and a rhodium oxide.

A capacitor lower electrode 110A of a platinum film with a thickness of, for example, 50 nm is formed on the second upper oxygen barrier layer 115A. The peripheral faces of the oxygen barrier layer 108A, the first upper oxygen barrier layer 114A, the second upper oxygen barrier layer 115A and the capacitor lower electrode 110A are covered with a second protection insulating film 111, and the upper face of the second protection insulating film 111 is placed at substantially the same level as the upper face of the capacitor lower electrode 110A.

A capacitor dielectric film 112A of an oxide dielectric film such as a ferroelectric film and a high dielectric film with a thickness of 10 nm through 200 nm is formed on the second protection insulating film 111 so as to have a lower face in contact with the capacitor lower electrode 110A. The capacitor dielectric film 112A is in contact with the capacitor lower electrode 110A and has a plane shape larger than that of the capacitor lower electrode 110A. The oxide dielectric film is not specified in its kind, and may be a ferroelectric film having a bismuth-layered perovskite structure such as $SrBi_2(Ta_{1-x}Nb_x)O_9$, or a film of lead zirconate titanate, strontium barium titanate, tantalum pentaoxide or the like.

A capacitor upper electrode 113A of a platinum film with a thickness of, for example, approximately 50 nm is formed on the capacitor dielectric film 112A, and the capacitor dielectric film 112A and the capacitor upper electrode 113A are covered with a third protection insulating film not shown.

In the semiconductor device of Embodiment 3, a multilayer structure including the first upper oxygen barrier layer 114A and the second upper oxygen barrier layer 115A is formed between the oxygen barrier layer 108A and the capacitor lower electrode 110A. Therefore, the diffusion of the oxygen atoms can be more effectively prevented than in the semiconductor device of Embodiment 2. As a result, the oxidation of the plug 107 can be further definitely prevented.

Embodiment 4

In Embodiment 4 of the invention, a method for fabricating the semiconductor device of Embodiment 2 will be described. A method for fabricating the semiconductor device of Embodiment 1 or 3 is basically the same as the fabrication method for the semiconductor device of Embodiment 2 and hence is omitted.

Figure 2A:
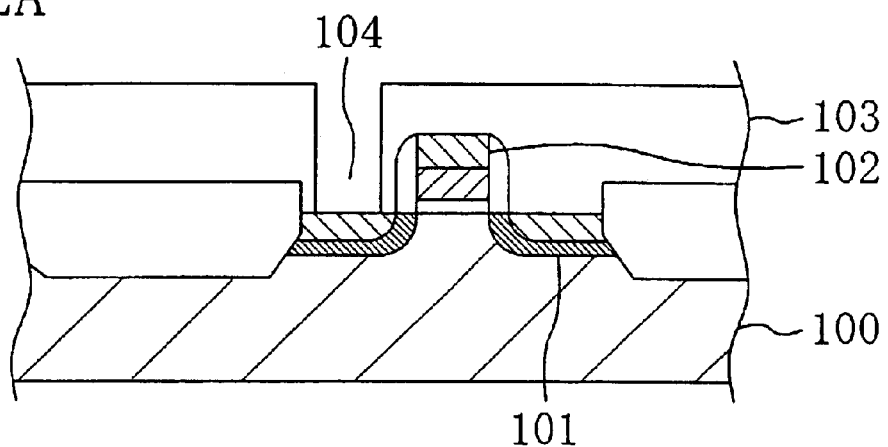
FIGS. 2A, 2B and 2C are cross-sectional views for showing procedures in a method for fabricating the semiconductor device of Embodiment 2.

First, as shown in FIG. 2A, a gate electrode 102 of a transistor is formed on a semiconductor substrate 100 by a known method, and a pair of impurity diffusion layers 101 serving as the source and the drain of the transistor are formed in regions of the semiconductor substrate 100 on both sides of the gate electrode 102.

Next, after forming a first protection insulating film 103 of, for example, a $TEOS-O_3$ film on the semiconductor substrate 100 so as to cover the transistor, the first protection insulating film 103 is planarized by CMP. Thereafter, the first protection insulating film 103 is selectively etched, so as to form a plug opening 104 by exposing one of the pair of impurity diffusion layers 101.

Figure 2B:
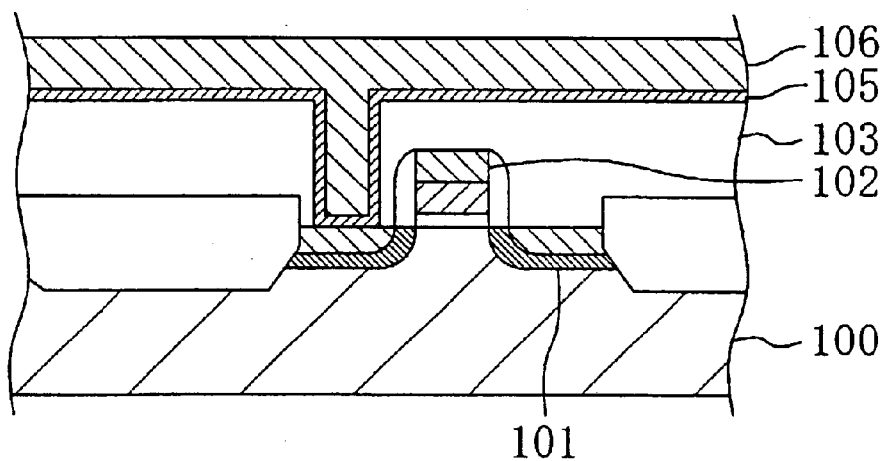

Then, as shown in FIG. 2B, a barrier metal 105 composed of a lower titanium film (with a thickness of 30 nm) and an upper titanium nitride film (with a thickness of 50 nm) and a tungsten film 106 (with a thickness of 600 nm) are successively deposited on the first protection insulating film 103 so as to fill the plug opening 104. Thereafter, portions of the barrier metal 105 and the tungsten film 106 exposed outside the plug opening 104 are removed by the CMP, thereby forming a plug 107 as shown in FIG. 2C.

Figure 2C:
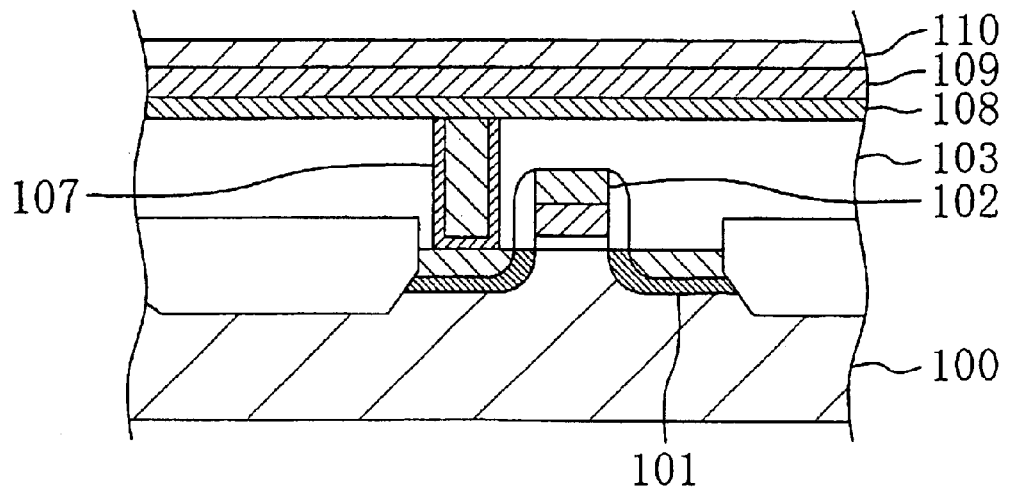

Next, as shown in FIG. 2C, an oxygen barrier layer 108 with a thickness of 20 nm through 200 nm of a composite nitride that is a mixture or an alloy of a first nitride having a conducting property and a second nitride having an insulating property is deposited on the first protection insulating film 103. The first nitride may be a nitride of at least one of titanium, tantalum, cobalt, copper and gallium, and the second nitride may be a nitride of at least one of aluminum, silicon, chromium, iron, zirconium and hafnium.

Subsequently, an upper oxygen barrier layer 109 with a thickness of, for example, 100 nm of a metal that has a conducting property even when oxidized is deposited on the oxygen barrier layer 108. The metal that has a conducting property even when oxidized may be at least one of iridium, ruthenium, rhenium, osmium, rhodium, platinum and gold. Instead of the metal that has a conducting property even when oxidized, the upper oxygen barrier layer 109 may be made from a metal oxide having a conducting property including at least one of an iridium oxide, a ruthenium oxide, a rhenium oxide, an osmium oxide and a rhodium oxide.

Then, a first platinum film 110 with a thickness of, for example, approximately 50 nm is deposited on the upper oxygen barrier layer 109 by sputtering.

Figure 3A:
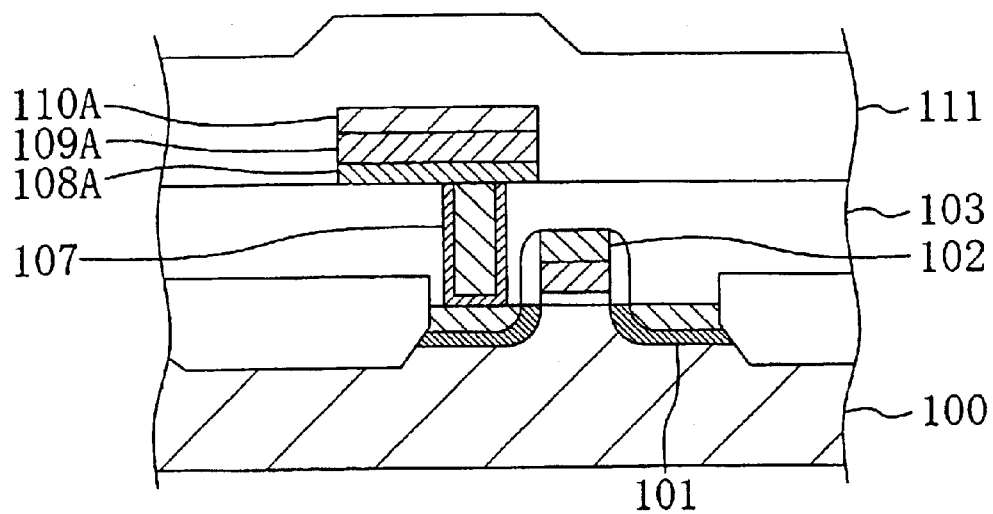
FIGS. 3A, 3B and 3C are cross-sectional views for showing other procedures in the method for fabricating the semiconductor device of Embodiment 2.

Next, as shown in FIG. 3A, the first platinum film 110, the upper oxygen barrier layer 109 and the oxygen barrier layer 108 are successively patterned, thereby forming a capacitor lower electrode 110A from the first platinum film 110 and forming a patterned upper oxygen barrier layer 109A and a patterned oxygen barrier layer 108A.

Then, a second protection insulating film 111 of, for example, a $TEOS-O_3$ film with a thickness of 400 nm is formed on the first protection insulating film 103 so as to cover the capacitor lower electrode 110A, the patterned upper oxygen barrier layer 109A and the patterned oxygen barrier layer 108A.

Figure 3B:
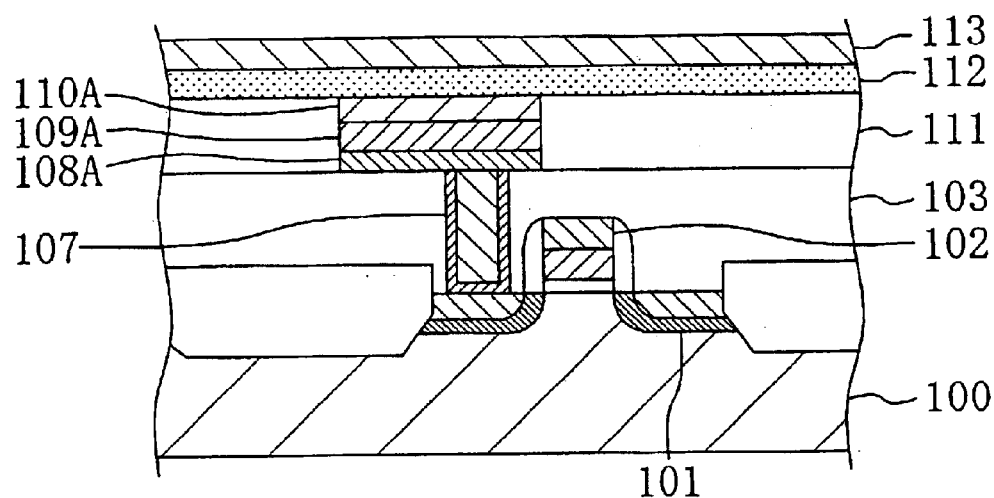

Subsequently, as shown in FIG. 3B, the second protection insulating film 111 is planarized by the CMP so as to place the upper face of the second protection insulating film 111 at substantially the same level as the upper face of the capacitor lower electrode 110A. Then, an oxide dielectric film 112 of a ferroelectric film or a high dielectric film with a thickness of 10 nm through 200 nm is deposited on the planarized second protection insulating film 111. The oxide dielectric film is not specified in its kind, and may be a ferroelectric film having a bismuth-layered perovskite structure such as $SrBi_2(Ta_{1-x}Nb_x)O_9$, or a film of lead zirconate titanate, strontium barium titanate, tantalum pentaoxide or the like. Also, the method for forming the oxide dielectric film 112 may be metal organic decomposition (MOD), metal organic chemical vapor deposition (MOCVD), the sputtering or the like.

Next, a second platinum film 113 with a thickness of, for example, approximately 50 nm is deposited on the oxide dielectric film 112 by the sputtering.

Figure 3C:
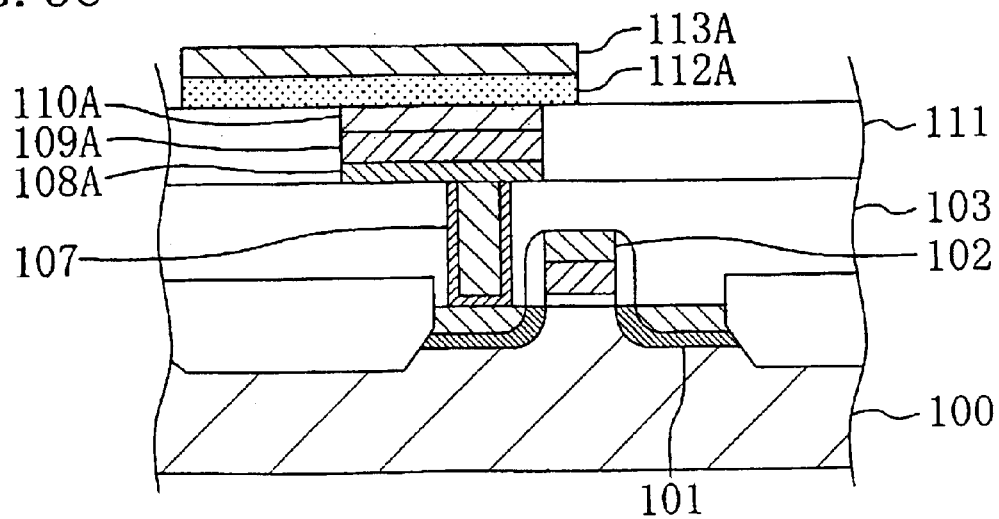

Then, as shown in FIG. 3C, the second platinum film 113 and the oxide dielectric film 112 are successively patterned, so as to form a capacitor upper electrode 113A from the second platinum film 113 and a capacitor dielectric film 112A from the oxide dielectric film 112 both in a plane shape larger than that of the upper oxygen barrier layer 109A and the oxygen barrier layer 108A. In this case, since the second platinum film 113 and the oxide dielectric film 112 are formed on the planarized second protection insulating film 111, there does not arise a problem of etching residue after patterning the second platinum film 113 and the oxide dielectric film 112.

Thereafter, the resultant semiconductor substrate 100 is subjected to annealing carried out in an oxygen atmosphere at a temperature of 600 through 800 for 10 through 60 minutes, thereby crystallizing the capacitor dielectric film 112A.

During the annealing for crystallization, oxygen atoms included in the oxygen atmosphere, which are to diffuse through the upper oxygen barrier layer 109A and the oxygen barrier layer 108A to reach the plug 107, are obstructed not only by the upper oxygen barrier layer 109A made from the metal that has a conducting property even when oxidized or the metal oxide having a conducting property but also by the oxygen barrier layer 108A made from the composite nitride that is a mixture or an alloy of the first nitride having a conducting property and the second nitride having an insulating property. As a result, the oxygen atoms minimally reach the plug 107.

The mechanism of the upper oxygen barrier layer 109A for preventing diffusion of the oxygen atoms is described in Embodiment 2, and the mechanism of the oxygen barrier layer 108A for preventing the diffusion of the oxygen atoms is described in Embodiment 1.

Also, during the annealing for the crystallization, the oxygen atoms included in the oxygen atmosphere pass through the second protection insulating film 111 before reaching the upper oxygen barrier layer 109A and the oxygen barrier layer 108A. Therefore, the number of oxygen atoms that can reach the upper oxygen barrier layer 109A and the oxygen barrier layer 108A is reduced.

Furthermore, since the plane shape of the capacitor dielectric film 112A is larger than that of the capacitor lower electrode 110A, the oxygen atoms included in the oxygen atmosphere migrate by a long distance within the second protection insulating film 111 before reaching the upper oxygen barrier layer 109A and the oxygen barrier layer 108A. Therefore, the number of oxygen atoms that can reach the upper oxygen barrier layer 109A and the oxygen barrier layer 108A is further reduced.

Accordingly, the number of oxygen atoms that can reach the plug 107 can be thus largely reduced, so as to definitely prevent oxidation of the plug 107.

Now, an electric characteristic test carried out on a conventional semiconductor device and the semiconductor device of Embodiment 2 will be described.

First, by using the structure of the conventional semiconductor device or the semiconductor device of Embodiment 2, contact chains are prepared each by serially connecting 1000 semiconductor devices through plugs by sharing impurity diffusion layers and capacitor lower electrodes (so that an (n−1)th transistor can share an impurity diffusion layer with an nth transistor and the nth transistor can share a capacitor lower electrode with an (n+1)th transistor) with the diameters of the plugs varied from 0.22 ìm to 0.30 ìm by 0.01 ìm in the respective constant chains. The annealing for crystallizing the capacitor dielectric films is carried out by keeping the semiconductor substrates at a substrate temperature of 700 for 1 hour in an oxygen atmosphere.

Figure 4:
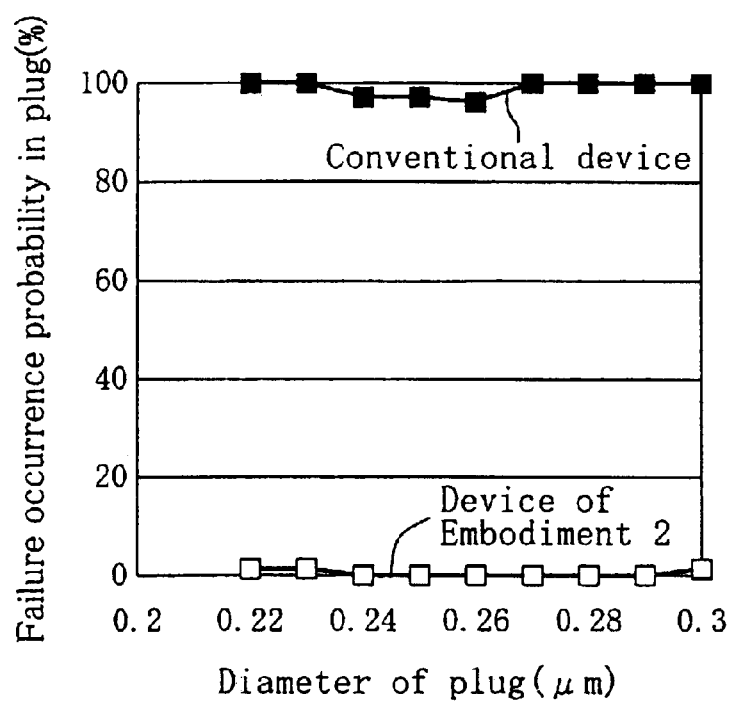
FIG. 4 is a diagram for showing the result of measurement of a failure occurrence probability in a contact chain including serially connected 1000 semiconductor devices.

FIG. 4 shows a failure occurrence probability measured in a test in which every contact chain including the serially connected 1000 semiconductor devices is decided to be faulty when its resistance obtained in applying a predetermined voltage to the both ends thereof exceeds a predetermined value. It is understood from FIG. 4 that the failure occurrence probability is remarkably low in using the semiconductor device of Embodiment 2. For example, when the plug has a diameter of 0.24 ìm, the failure occurrence probability is 0% in the contact chain using the semiconductor device of Embodiment 2 while the failure occurrence probability is 98% in the contact chain using the conventional semiconductor device. Thus, the characteristic can be remarkably improved.

Figure 5:
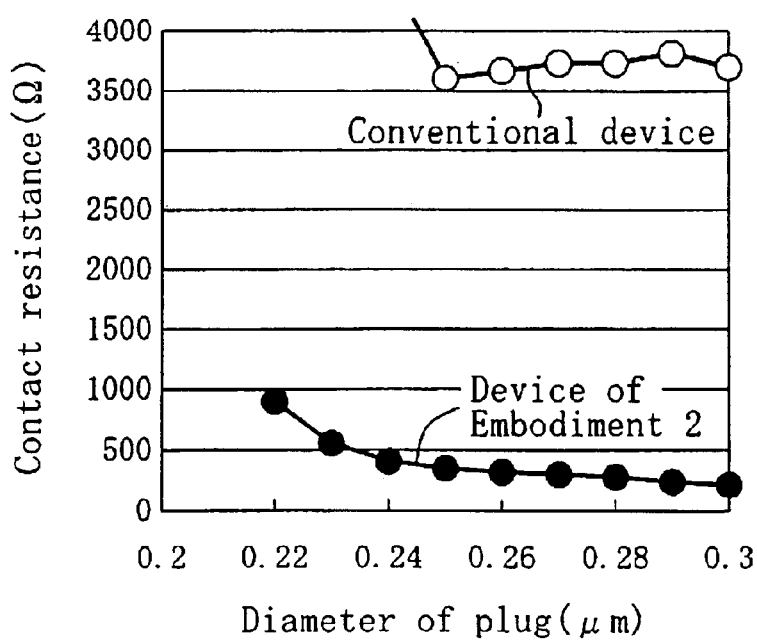
FIG. 5 is a diagram for showing contact resistance corresponding to resistance of each plug.
Figure 6A:
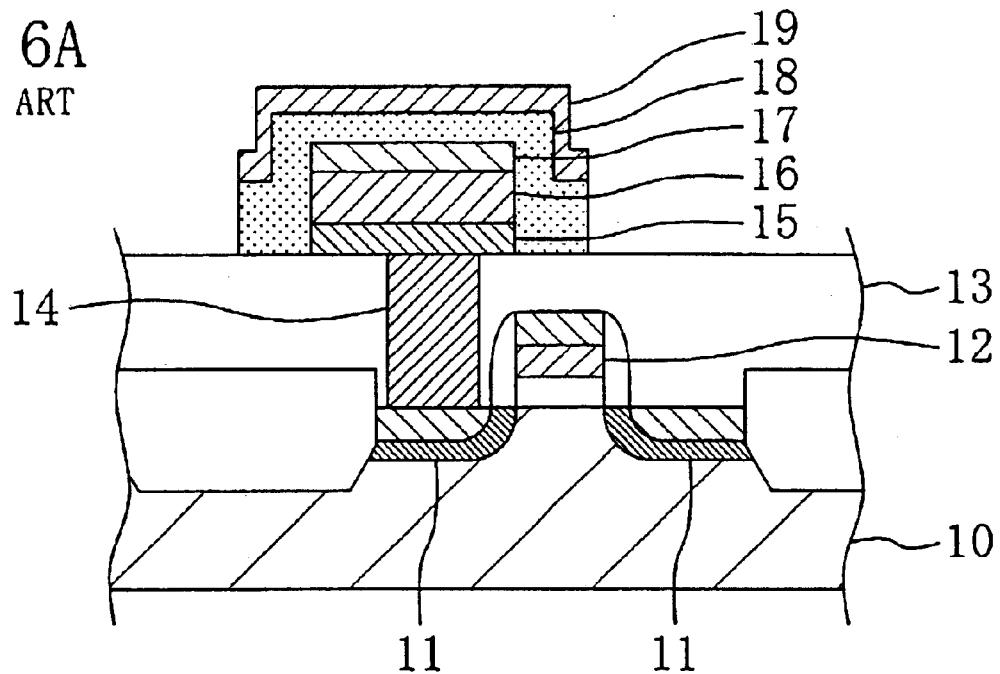
FIG. 6A is a cross-sectional view of a conventional semiconductor device and FIG. 6B is a cross-sectional view for explaining a problem of the conventional semiconductor device.
Figure 6B:
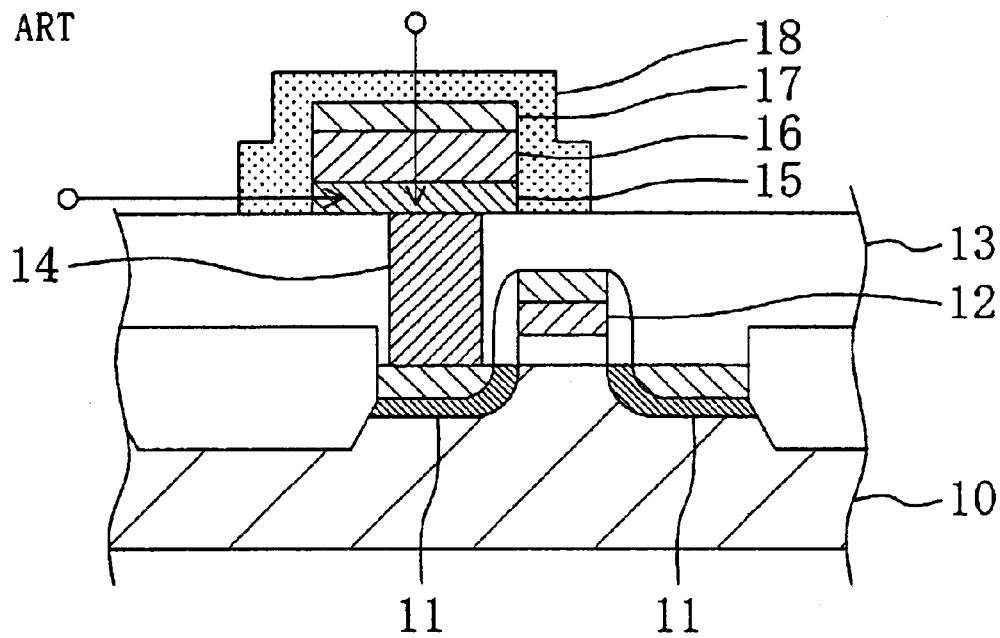

FIG. 5 shows contact resistance corresponding to resistance of each plug calculated by dividing, by 1000, resistance obtained by applying a predetermined voltage to the both ends of each contact chain including the serially connected 1000 semiconductor devices. When the plug has a diameter of 0.24 ìm, the contact resistance of the semiconductor device of Embodiment 2 is 400 Ù while the contact resistance is 4 kÙ or more in the conventional semiconductor device. In this manner, according to Embodiment 2, contact resistance applicable to an actual device can be obtained even when high temperature annealing is carried out in an oxygen atmosphere.

What is claimed is:

1. A method for fabricating a semiconductor device comprising the steps of:

forming an impurity diffusion layer serving as a source or a drain of a transistor in a semiconductor substrate;

forming a first protection insulating film covering said transistor;

burying, in said first protection insulating film, a plug having a lower end electrically connected to said impurity diffusion layer of said transistor;

forming, on said first protection insulating film, an oxygen barrier layer having a lower face connected to an upper end of said plug;

forming a capacitor lower electrode on said oxygen barrier layer;

forming, on said first protection insulating film, a second protection insulating film covering said oxygen barrier layer and said capacitor lower electrode, and planarizing said second protection insulating film, whereby placing an upper face of said second protection insulating film at substantially the same level as an upper face of said capacitor lower electrode;

forming a capacitor dielectric film having a plane shape larger than a plane shape of said capacitor lower electrode by depositing an oxide dielectric film on said capacitor lower electrode and said second protection insulating film and patterning said oxide dielectric film; and forming a capacitor upper electrode on said capacitor dielectric film.

2. The method for fabricating a semiconductor device of claim 1, wherein said oxygen barrier layer is made from a composite nitride that is a mixture or an alloy of a first nitride having a conducting property and a second nitride having an insulating property.

3. The method for fabricating a semiconductor device of claim 1, further comprising, between the step of forming said oxygen barrier layer and the step of forming said capacitor lower electrode, a step of forming an upper oxygen barrier layer made from a metal that has a conducting property when it is oxidized.

4. The method for fabricating a semiconductor device of claim 1, further comprising, between the step of forming said oxygen barrier layer and the step of forming said capacitor lower electrode, a step of forming an upper oxygen barrier layer made from a metal oxide having a conducting property.

* * * * *